(12) United States Patent
Lee et al.

(10) Patent No.: US 9,735,076 B2
(45) Date of Patent: Aug. 15, 2017

(54) EPOXY RESIN COMPOSITION FOR ENCAPSULATING SEMICONDUCTOR DEVICE AND SEMICONDUCTOR DEVICE ENCAPSULATED BY THE SAME

(71) Applicant: SAMSUNG SDI CO., LTD., Yongin-si, Gyeonggi-do (KR)

(72) Inventors: Yoon Man Lee, Uiwang-si (KR); So Yoon Kim, Uiwang-si (KR)

(73) Assignee: SAMSUNG SDI CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 15/162,647

(22) Filed: May 24, 2016

(65) Prior Publication Data

US 2016/0351461 A1 Dec. 1, 2016

(30) Foreign Application Priority Data

May 27, 2015 (KR) ........................ 10-2015-0074321

(51) Int. Cl.
*H01L 21/00* (2006.01)
*H01L 23/29* (2006.01)
(Continued)

(52) U.S. Cl.
CPC ............ *H01L 23/295* (2013.01); *H01L 21/56* (2013.01); *H01L 23/3128* (2013.01); *H01L 23/34* (2013.01); *H01L 23/544* (2013.01); *H01L 24/33* (2013.01); *H01L 24/49* (2013.01); *H01L 24/73* (2013.01); *H01L 23/13* (2013.01); *H01L 2223/54406* (2013.01); *H01L 2223/54486* (2013.01); *H01L 2224/32225* (2013.01); *H01L 2224/3315* (2013.01); *H01L 2224/4824* (2013.01); *H01L 2224/48091* (2013.01); *H01L 2224/48106* (2013.01); *H01L 2224/48225* (2013.01); *H01L 2224/73215* (2013.01); *H01L 2924/0102* (2013.01); *H01L 2924/01003* (2013.01); *H01L 2924/0103* (2013.01); *H01L 2924/0104* (2013.01); *H01L 2924/0105* (2013.01); *H01L 2924/0108* (2013.01); *H01L 2924/01011* (2013.01); *H01L 2924/01013* (2013.01); *H01L 2924/01019* (2013.01); *H01L 2924/01021* (2013.01); *H01L 2924/01022* (2013.01); *H01L 2924/01023* (2013.01);
(Continued)

(58) Field of Classification Search
CPC ................. H01L 2924/01079; H01L 2924/14
USPC ......................................................... 438/127
See application file for complete search history.

(56) References Cited

U.S. PATENT DOCUMENTS

2003/0162895 A1* 8/2003 Gaggar ................... C08L 33/14
525/70
2005/0230960 A1* 10/2005 Bilodeau ............... G09F 3/0292
283/75
(Continued)

FOREIGN PATENT DOCUMENTS

JP 2008-133325 A 6/2008

*Primary Examiner* — Jami M Valentine
(74) *Attorney, Agent, or Firm* — Lee & Morse, P.C.

(57) ABSTRACT

An epoxy resin composition for encapsulating a semiconductor device and a semiconductor device encapsulated by the epoxy resin composition, the composition including a base resin; a filler; a colorant; and a thermochromic pigment, wherein a color of the thermochromic pigment is irreversibly changed when a temperature thereof exceeds a predetermined temperature.

21 Claims, 2 Drawing Sheets

(51) Int. Cl.
  *H01L 23/34* (2006.01)
  *H01L 21/56* (2006.01)
  *H01L 23/544* (2006.01)
  *H01L 23/00* (2006.01)
  *H01L 23/31* (2006.01)
  *H01L 23/13* (2006.01)

(52) U.S. Cl.
  CPC .............. *H01L 2924/01024* (2013.01); *H01L 2924/01025* (2013.01); *H01L 2924/01026* (2013.01); *H01L 2924/01027* (2013.01); *H01L 2924/01028* (2013.01); *H01L 2924/01029* (2013.01); *H01L 2924/01031* (2013.01); *H01L 2924/01037* (2013.01); *H01L 2924/01038* (2013.01); *H01L 2924/01039* (2013.01); *H01L 2924/01041* (2013.01); *H01L 2924/01042* (2013.01); *H01L 2924/01043* (2013.01); *H01L 2924/01044* (2013.01); *H01L 2924/01045* (2013.01); *H01L 2924/01046* (2013.01); *H01L 2924/01047* (2013.01); *H01L 2924/01048* (2013.01); *H01L 2924/01049* (2013.01); *H01L 2924/01055* (2013.01); *H01L 2924/01056* (2013.01); *H01L 2924/01071* (2013.01); *H01L 2924/01072* (2013.01); *H01L 2924/01073* (2013.01); *H01L 2924/01074* (2013.01); *H01L 2924/01075* (2013.01); *H01L 2924/01076* (2013.01); *H01L 2924/01077* (2013.01); *H01L 2924/01078* (2013.01); *H01L 2924/01079* (2013.01); *H01L 2924/01081* (2013.01); *H01L 2924/01082* (2013.01); *H01L 2924/01087* (2013.01); *H01L 2924/01088* (2013.01); *H01L 2924/06* (2013.01); *H01L 2924/0665* (2013.01); *H01L 2924/181* (2013.01); *H01L 2924/186* (2013.01)

(56) References Cited

U.S. PATENT DOCUMENTS

| | | | | |
|---|---|---|---|---|
| 2005/0250879 A1* | 11/2005 | Correll | ............... | C09D 5/031 523/221 |
| 2007/0232756 A1* | 10/2007 | Kim | ............... | A63B 37/0003 525/221 |
| 2007/0251912 A1* | 11/2007 | Sixou | ............... | B65D 79/02 215/263 |
| 2008/0090943 A1* | 4/2008 | Xu | ............... | C08G 18/10 523/461 |
| 2012/0201995 A1* | 8/2012 | Melle | ............... | B05C 3/005 428/68 |
| 2013/0164683 A1* | 6/2013 | Choi | ............... | G03F 7/004 430/285.1 |

* cited by examiner

EPOXY RESIN COMPOSITION FOR ENCAPSULATING SEMICONDUCTOR DEVICE AND SEMICONDUCTOR DEVICE ENCAPSULATED BY THE SAME

CROSS-REFERENCE TO RELATED APPLICATION

Korean Patent Application No. 10-2015-0074321, filed on May 27, 2015, in the Korean Intellectual Property Office, and entitled: "Epoxy Resin Composition for Encapsulating Semiconductor Device and Semiconductor Device Encapsulated By the Same," is incorporated by reference herein in its entirety.

BACKGROUND

1. Field

Embodiments relate to an epoxy resin composition for encapsulating a semiconductor device and a semiconductor device encapsulated using the same.

2. Description of the Related Art

In order to protect a semiconductor device from an external environment such as moisture, mechanical shock, and the like, encapsulation of the semiconductor device using an epoxy resin composition has been considered.

Recently, with rapidly increasing use of miniaturized and compact electronic devices, semiconductor packages provided to the electronic devices are also developed to have a light, thin, and slim structure. In addition, in order to provide a pleasing appearance to a device such as a smartphone, an SD memory card, and the like so as to be confirmed through the naked eye of a user, a color package having various colors is increasingly used, in addition to existing black packages.

SUMMARY

Embodiments are directed to an epoxy resin composition for encapsulating a semiconductor device and a semiconductor device encapsulated using the same.

The embodiments may be realized by providing an epoxy resin composition for encapsulating a semiconductor device, the composition including a base resin; a filler; a colorant; and a thermochromic pigment, wherein a color of the thermochromic pigment is irreversibly changed when a temperature thereof exceeds a predetermined temperature.

The thermochromic pigment may be a metal oxalate pigment.

The thermochromic pigment may be represented by the following Formula 1:

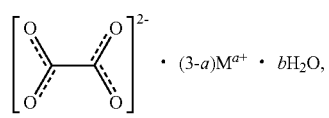

$$(1)$$

wherein, in Formula 1, a is 1 or 2, b is 1 to 10, and M is a metal element.

The metal element may be an alkali metal, an alkali earth metal, a group XIII element, a group XIV element, a group XI element, a group XII element, a group III element, a group IV element, a group V element, a group VI element, a group VII element, a group VIII element, a group IX element, or a group X element.

The predetermined temperature at which the thermochromic pigment undergoes the irreversible color change may be about 260° C. or higher.

The thermochromic pigment may be present in the epoxy resin composition in an amount of about 0.01 wt % to about 5 wt %, based on a total weight of the epoxy resin composition.

The colorant may include sodium, calcium, aluminum, tin, gold, zinc, yttrium, titanium, tantalum, chromium, manganese, iron, cobalt, iridium, nickel, palladium, or mixtures thereof.

The colorant may be present in the epoxy resin composition in an amount of about 0.05 wt % to about 10 wt %, based on a total weight of the epoxy resin composition.

The base resin may include an epoxy resin and a curing agent.

The composition may include about 1 wt % to about 30 wt % of the base resin, about 65 wt % to about 97 wt % of the filler, about 0.05 wt % to about 10 wt % of the colorant, and about 0.01 wt % to about 5 wt % of the thermochromic pigment, all wt % being based on a total weight of the epoxy resin composition.

The epoxy resin composition may further include: a curing accelerator.

The curing accelerator may include a triphenylphosphine compound, an imidazole compound, or mixtures thereof.

The curing accelerator may be present in the epoxy resin composition in an amount of about 0.001 wt % to about 1 wt %, based on a total weight of the epoxy resin composition.

The epoxy resin composition may further include a white additive, the white additive including talc, barium sulfate, zinc sulfide, zinc sulfate, kaolin, or mixtures thereof.

The white additive may be present in the epoxy resin composition in an amount of about 0.1 wt % to about 20 wt %, based on a total weight of the epoxy resin composition.

The epoxy resin composition may further include a silane coupling agent.

The color of the thermochromic pigment after the irreversible change may be different from a color of the colorant.

The color of the thermochromic pigment after the irreversible change may be complementary to a color of the colorant.

The embodiments may be realized by providing a semiconductor device encapsulated by the epoxy resin composition according to an embodiment.

The embodiments may be realized by providing a method of manufacturing a device, the method including encapsulating a semiconductor device with the epoxy resin composition according to an embodiment; and marking a site on the encapsulated semiconductor device such that the site maintains a color that is different from other parts of the encapsulated semiconductor.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
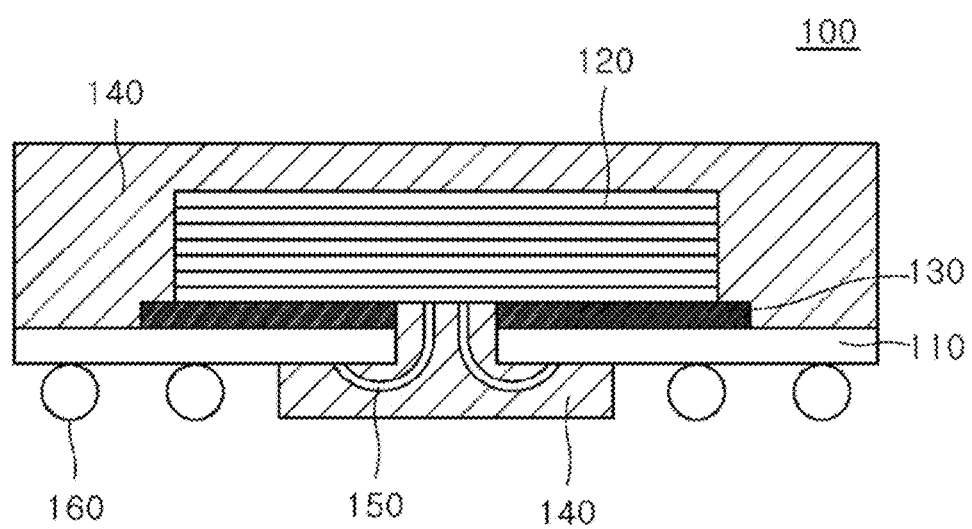
FIG. 1 illustrates a schematic sectional view of a semiconductor package according to one embodiment.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. Like reference numerals refer to like elements throughout.

An epoxy resin composition for encapsulating a semiconductor device according to one embodiment may include, e.g., a base resin, filler, a colorant, and a thermochromic pigment (that is different from the colorant).

Thermochromic Pigment

Herein, a thermochromic pigment refers to a pigment compound, a color of which is irreversibly changed in response to temperature increase, e.g., is irreversibly changed upon reaching or exceeding a particular or predetermined temperature, and maintains the changed color even after returning to a lower or initial temperature thereof, thereby maintaining a discolored state of a marking site on a semiconductor package. Herein, the term "color" may be a color other than black and/or gray.

A changed color of the thermochromic pigment due to temperature increase may differ depending upon a kind of metal included in the thermochromic pigment and a combination thereof. For example, in an effort to help provide good visibility, the changed color of the thermochromic pigment may be different from the color of the colorant. For example, the change color of the thermochromic pigment may be selected so as to become a complementary color or contrasting color with respect to a color of the colorant.

In an implementation, when the temperature of a marking site increases (in response to laser marking on a semiconductor package exhibiting various colors such as red, green, blue, white (RGBW), and black by the colorant), the color of the thermochromic pigment at the marking site may be changed in response to the temperature increase, thereby facilitating marking. The changed color of the thermochromic pigment due to temperature increase may differ depending upon, e.g., the kind of metal included in the thermochromic pigment and a combination thereof, as described above. When the changed color is a complementary color with respect to the color of the colorant, it is possible to exhibit good marking visibility. In addition, the epoxy resin composition including the thermochromic pigment may have high heat resistance to help suppress discoloration of the semiconductor package due to heat, thereby reducing and/or preventing repeated marking while facilitating marking at low laser intensity. As a result, it is possible to reduce and/or prevent damage to a semiconductor chip.

The thermochromic pigment may include, e.g., a metal oxalate pigment.

In an implementation, the metal oxalate pigment may be represented by the following Formula 1.

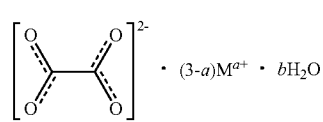

(1)

In Formula 1, a may be 1 or 2, b may be 1 to 10, and M may be a metallic element.

In an implementation, the metal element may be selected from among, e.g., alkali metals, alkali earth metals, group XIII elements, group XIV elements, group XI elements, group XII elements, group III elements (including the lanthanides and the actinides), group IV elements, group V elements, group VI elements, group VII elements, group VIII elements, group IX elements, and/or group X elements. Such metal elements may facilitate the changed color of the thermochromic pigment to be a complementary color with respect to a color of the colorant.

In an implementation, the alkali metal may include at least one of lithium (Li), sodium (Na), potassium (K), rubidium (Rb), cesium (Cs), and francium (Fr). In an implementation, the alkali earth metal may include at least one of calcium (Ca), strontium (Sr), barium (Ba), and radium (Ra). In an implementation, the group XIII element may include at least one of aluminum (Al), gallium (Ga), indium (In), and thallium (Tl).

In an implementation, the group XIV element may include at least one of tin (Sn) and lead (Pb). In an implementation, the group XI element may include at least one of copper (Cu), silver (Ag), and gold (Au). In an implementation, the group XII element may include at least one of zinc (Zn), cadmium (Cd), and mercury (Hg). In an implementation, the group III element may include at least one of scandium (Sc), yttrium (Y), lutetium (Lu), and lawrencium (Lr). In an implementation, the lanthanide elements may include elements having atomic numbers of 57 to 70. In an implementation, the group IV element may include at least one of titanium (Ti), zirconium (Zr), and hafnium (Hf). In an implementation, the group V element may include at least one of vanadium (V), niobium (Nb), and tantalum (Ta). In an implementation, the group VI element may include at least one of chromium (Cr), molybdenum (Mo), and tungsten (W). In an implementation, the group VII element may include at least one of manganese (Mn), technetium (Tc), and rhenium (Re). In an implementation, the group VIII element may include at least one of iron (Fe), ruthenium (Ru), and osmium (Os). In an implementation, the group IX element may include at least one of cobalt (Co), rhodium (Rh), and iridium (Ir). In an implementation, the group X element may include at least one of nickel (Ni), palladium (Pd), and platinum (Pt). In an implementation, the actinide element may include at least one of elements with atomic numbers of 89 to 102.

A value of b in Formula 1 may vary depending upon the kind of metal oxalate hydrate. In an implementation, b may be 1 to 10, e.g., 1 to 6 or 1 to 4. Within this range, the thermochromic pigment may exhibit a clear color change. In an implementation, b may be an integer of 1 to 10.

In an implementation, the metal oxalate pigment may be aluminium oxalate, iron(III) oxalate hexahydrate and the like.

The thermochromic pigment may facilitate a color change at a temperature of higher than or equal to about 260° C. An IR reflow process of a semiconductor fabrication process may have a maximum temperature of about 260° C., and it may be desirable that the thermochromic pigment be formulated to have a color change temperature of higher than 260° C. in order to prevent premature color change due to IR reflow. In an implementation, the thermochromic pigment may have a color change temperature of 270° C. to 350° C., e.g., 280° C. to 330° C. Within this range of the color change temperature, it is possible to help prevent damage to a semiconductor chip due to laser marking.

The thermochromic pigment may be present in the epoxy resin composition in an amount of about 0.01 wt % to about 5 wt %, e.g., about 0.05 wt % to about 3 wt %, based on a total weight of the epoxy resin composition. Within this range, the epoxy resin composition may provide excellent marking visibility and facilitate clear color exhibition of a semiconductor package.

Colorant

In an implementation, the colorant may be used to facilitate the semiconductor package to exhibit various colors such as red, green, blue, and white (RGBW). For example, the colorant may be different from, e.g., may have a different structure relative to, the thermochromic pigment.

The colorant may include, e.g., sodium (Na), calcium (Ca), aluminum (Al), tin (Sn), gold (Au), zinc (Zn), yttrium (Y), titanium (Ti), tantalum (Ta), chromium (Cr), manganese (Mn), iron (Fe), cobalt (Co), iridium (Ir), nickel (Ni), palladium (Pd), or mixtures thereof. In an implementation, the colorant may include, e.g., a mixture of gold (Au)-yttrium (Y)-sodium (Na), a mixture of cobalt (Co)-gold (Au)-chromium (Cr), a mixture of cobalt (Co)-chromium (Cr)-aluminum (Al)-zinc (Zn), or a mixture of titanium (Ti)-calcium (Ca).

In an implementation, the colorant may be present in an amount of about 0.05 wt % to about 10 wt %, e.g., about 0.1 wt % to about 5 wt %, based on a total weight of the resin composition. Within this range, the epoxy resin composition can allow clear color exhibition of a semiconductor package while preventing deterioration in electrical insulation of the resin composition.

Base Resin

In an implementation, the base resin may include an epoxy resin and a curing agent.

In an implementation, the base resin may be present in an amount of about 1 wt % to about 30 wt %, e.g., about 1.5 wt % to about 25 wt %, based on a total weight of the resin composition.

Epoxy Resin

The epoxy resin may include an epoxy compound containing at least two epoxy groups per molecule. Examples of the epoxy resins may include epoxy resins obtained by epoxidation of a condensate of hydroxybenzaldehyde and phenols or alkyl phenols, phenol novolac type epoxy resins, cresol novolac type epoxy resins, biphenyl type epoxy resins, phenol aralkyl type epoxy resins, polyfunctional epoxy resins, naphthol novolac type epoxy resins, novolac type epoxy resins of bisphenol A/bisphenol F/bisphenol AD, glycidyl ethers of bisphenol A/bisphenol F/bisphenol AD, bishydroxybiphenyl epoxy resins, dicyclopentadiene epoxy resins, and the like.

In an implementation, the epoxy resin may include, e.g., an ortho-cresol novolac type epoxy resin represented by Formula 2, a biphenyl type epoxy resin represented by Formula 3, a phenol aralkyl type epoxy resin represented by Formula 4, or mixtures thereof. Use of such an epoxy resin may provide good heat resistance and reliability to the epoxy resin composition.

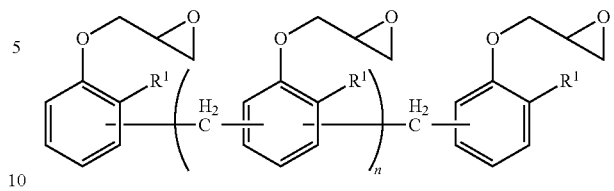

<Formula 2>

In Formula 2, $R^1$ may each independently be, e.g., hydrogen or a $C_1$ to $C_4$ alkyl group, and n may be, e.g., 1 to 7 on average.

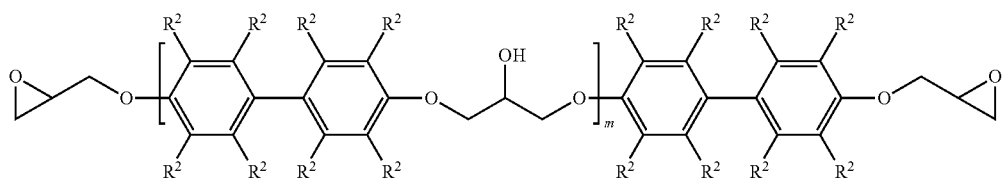

<Formula 3>

In Formula 3, $R^2$ may each independently be, e.g., hydrogen or a $C_1$ to $C_4$ alkyl group, and m may be, e.g., 0 to 7 on average.

<Formula 4>

In Formula 4, k may be, e.g., 1 to 7 on average.

In an implementation, each of $R^1$ and $R^2$ may be a methyl group or an ethyl group, e.g., a methyl group.

These epoxy resins may be used alone or in combination thereof. In an implementation, the epoxy resin may be used in the form of adducts, such as a melt master batch, obtained by pre-reaction of these epoxy resins with other additives, such as a curing agent, a curing accelerator, a release agent, a coupling agent, and a stress relieving agent. In an implementation, an epoxy resin containing a low amount of chlorine ions, sodium ions, and other ionic impurities may be used in order to improve moisture resistance.

In an implementation, the epoxy resin may be present in an amount of about 0.5 wt % to about 17 wt %, e.g., about 0.5 wt % to about 15 wt %, based on the total weight of the epoxy resin composition. With this range of the epoxy resin, the resin composition can exhibit excellent flowability, flame retardancy, and reliability.

Curing Agent

The curing agent may be a curing agent for epoxy resins and may have a solid or liquid phase. Examples of the curing agent may include phenol aralkyl type phenol resins; phenol novolac type phenol resins; xylok type phenol resins; cresol novolac type phenol resins; naphthol type phenol resins; terpene type phenol resins; polyfunctional phenol resins; dicyclopentadiene phenol resins; novolac type phenol resins prepared from bisphenol A and resol; tris(hydroxyphenyl)

methane; multivalent phenol compounds containing dihydroxy biphenyl; acid anhydrides such as maleic anhydride and phthalic anhydride; aromatic amines such as meta-phenylene diamine, diamino diphenyl methane, and diamino diphenylsulfone; and mixtures thereof.

In an implementation, the curing agent may be a phenol novolac type phenol resin represented by Formula 5, a xylok type phenol resin represented by Formula 6, a phenol aralkyl type phenol resin represented by Formula 7, or a mixture thereof.

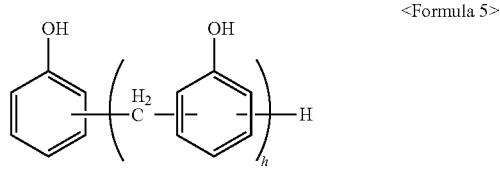

<Formula 5>

In Formula 5, h may be, e.g., 1 to 7 on average.

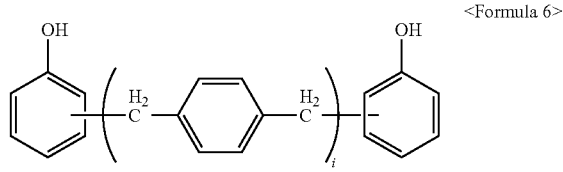

<Formula 6>

In Formula 6, i may be, e.g., 1 to 7 on average.

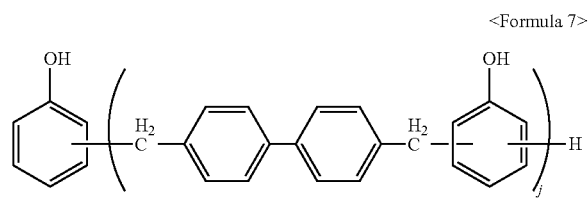

<Formula 7>

In Formula 7, j may be, e.g., 1 to 7 on average.

In an implementation, the curing agents may be used in the form of adducts, such as a melt master batch, obtained by pre-reacting the curing agents with other components such as an epoxy resin. These curing agents may be used alone or in combination thereof. In an implementation, the curing agent may be present in an amount of about 0.5 to about 13 wt %, e.g., about 1 to about 10 wt %, based on the total weight of the epoxy resin composition. Within this range, the curing agent may not generate large amounts of unreacted epoxy resins and phenolic hydroxyl groups, thereby securing good reliability of the resin composition.

A mixing ratio of the epoxy resin to the curing agent may be adjusted according to mechanical properties and moisture resistance of a semiconductor package. In an implementation, a chemical equivalent ratio of the epoxy resin to the curing agent may be about 0.95 to about 2, e.g. about 1 to about 1.75. Within this range, the resin composition may help provide excellent mechanical strength and moisture resistance to the package.

Filler

The filler may be used to help improve mechanical properties of the epoxy resin composition while reducing stress of the composition. In an implementation, the filler may be inorganic filler.

Examples of the inorganic filler may include fused silica, crystalline silica, calcium carbonate, magnesium carbonate, alumina, magnesia, clay, talc, calcium silicate, titanium oxide, antimony oxide, and glass fibers. These may be used alone or in combination thereof.

In an implementation, fused silica having a low coefficient of linear expansion may be used to help reduce stress. Fused silica refers to amorphous silica having a specific gravity of 2.3 or less. Fused silica may be produced by melting crystalline silica or may include amorphous silica prepared from various materials.

In an implementation, the inorganic fillers may have an average particle diameter of about 0.001 μm to about 30 μm, e.g., spherical fused silica having an average particle diameter of about 0.001 μm to about 30 μm. The fillers may be a mixture of spherical fused silica having different particle diameters. In an implementation, the fillers may include a fused silica mixture including about 50 wt % to about 99 wt % of spherical fused silica having an average particle diameter of about 5 μm to about 30 μm and about 1 wt % to about 50 wt % of spherical fused silica having an average particle diameter of about 0.001 μm to about 1 μm. In addition, the maximum particle diameter of the fused silica may be adjusted to any one of about 45 μm, about 55 μm, and about 75 μm depending upon desired use of the resin composition.

In an implementation, the filler may include a mixture of fused silica and fumed silica. In the mixture, dry silica may have a BET specific surface area of, e.g., about 200 m$^2$/g or more. Within this range, the dry silica can control inertia of the filler.

The filler may be subjected to surface treatment with at least one coupling agent selected from epoxy silane, amino silane, mercapto silane, alkyl silane, and/or alkoxy silane coupling agents.

In the epoxy resin composition, the amount of the filler may be suitably determined depending upon desired properties such as formability, low stress, and high temperature strength of the epoxy resin composition. In an implementation, the filler may be present in an amount of about 55 wt % to about 97 wt %, e.g., about 67 wt % to about 95 wt %, about 70 wt % to about 94 wt %, or about 82 wt % to about 92 wt %, based on the total weight of the epoxy resin composition. With this content range of the filler, the epoxy resin composition may exhibit good warpage characteristics and reliability of a semiconductor package while securing good flowability and formability.

Curing Accelerator

In an implementation, the epoxy resin composition for encapsulating a semiconductor device may further include a curing accelerator.

The curing accelerator may help promote a crosslinking reaction between the epoxy resin and a phenolic curing agent. Examples of the curing accelerator may include tertiary amines, organometallic compounds, organophosphorus compounds, imidazole compounds, boron compounds, and the like.

Examples of the tertiary amines may include benzyldimethylamine, triethanolamine, triethylenediamine, dimethylaminoethanol, tri(dimethylaminomethyl)phenol, 2-2-(dimethylaminomethyl)phenol, 2,4,6-tris(diaminomethyl) phenol, and salts of tri-2-ethylhexanoic acid.

Examples of the organometallic compounds may include chromium acetylacetonate, zinc acetylacetonate, and nickel acetylacetonate. Examples of the organophosphorus compounds may include tris(4-methoxy)phosphine, tributylphosphonium bromide, triphenylphosphonium bromide, phenylphosphine, diphenylphosphine, triphenylphosphine, triphenylphosphine triphenylborane, and triphenylphosphine-1,4-benzoquinone adducts. Examples of the imidazole compounds may include 2-methylimidazole, 2-phenylimidazole, 2-aminoimidazole, 2-methyl-1-vinylimidazole, 2-ethyl-4-methylimidazole, and 2-heptadecylimidazole. Examples of the boron compounds may include tetraphenylphosphonium tetraphenylborate, triphenylphosphine tetraphenylborate, tetraphenylboron salts, trifluoroborane-n-hexylamine, trifluoroborane monoethylamine, tetrafluoroborane triethylamine, and tetrafluoroborane amine. In an implementation, 1,5-diazabicyclo[4.3.0]non-5-ene, 1,8-diazabicyclo[5.4.0]undec-7-ene, and phenol novolac resin salts may be used.

In an implementation, as the curing accelerator, an organophosphorus compound, an imidazole compound, or a mixture thereof may be used. The curing accelerator may have low temperature dependency and may help prevent discoloration of a semiconductor package due to heat.

In an implementation, the curing accelerator may be used in the form of adducts obtained by pre-reacting these curing accelerators with at least one of the epoxy resin and the curing agent.

In an implementation, the curing accelerator may be present in an amount about 0.001 wt % to about 1.5 wt %, e.g., about 0.01 wt % to about 1 wt %, based on the total weight of the epoxy resin composition. Within this range, the curing accelerator may help promote curing of the resin composition while securing good flowability and heat resistance of the resin composition.

White Additive

In an implementation, the epoxy resin composition for encapsulating a semiconductor device may further include a white additive.

When a chip is visible from the outside, the chip may be recognized as or considered a process defect, and thus may be unsuitable for an automated process. Thus, the white additive may be added to the resin composition in order to help reduce and/or prevent a chip inside a semiconductor package from being visible from the outside by improving chip shielding performance.

In an implementation, the white additive may include, e.g., talc, barium sulfate, zinc sulfide, zinc sulfate, kaolin, titanium oxide, or mixtures thereof. For example, barium sulfate, zinc sulfide or a mixture thereof may be used as the white additive. The white additive may help provide good chip shielding performance while preventing discoloration of a semiconductor package due to heat.

In an implementation, the white additive may be present in an amount of about 0.1 wt % to about 20 wt %, e.g., about 0.5 wt % to about 10 wt %, based on the total weight of the epoxy resin composition. Within this range, the white additive may help secure good chip shielding performance while allowing clear color exhibition of a semiconductor package.

Silane Coupling Agent

In an implementation, the epoxy resin composition for encapsulating a semiconductor device may include a silane coupling agent. The silane coupling agent may include, e.g., an epoxy silane compound, an amino silane compound, a mercapto silane compound, an alkyl silane compound, and an alkoxy silane compound.

As for the silane coupling agent, a suitable silane coupling agent may be used. For example, a silane coupling agent containing an amino group or an epoxy group may help provide good adhesion and chemical resistance. In an implementation, the silane coupling agent may include an epoxy structure-containing silicon compound, such as 3-glycidoxypropyltrimethoxysilane, 3-glycidoxypropylmethyldimethoxysilane, and 2-(3,4-epoxycyclohexyl)ethyltrimethoxysilane; a polymerizable unsaturated group-containing silicon compound, such as vinyltrimethoxysilane, vinyltriethoxysilane, (meth)acryloxypropyltrimethoxysilane; an amino group-containing silicon compound, such as 3-aminopropyltrimethoxysilane, 3-aminopropyltriethoxysilane, N-(2-aminoethyl)-3-aminopropyltrimethoxysilane, and N-(2-aminoethyl)-3-aminopropylmethyldimethoxysilane; and/or 3-chloropropyltrimethoxysilane.

In an implementation, the silane coupling agent may be present in an amount of about 0.01 wt % to about 5 wt %, e.g., about 0.05 wt % to about 3 wt %, based on the total weight of the epoxy resin composition. Within this range, the silane coupling agent may help provide good properties in terms of adhesion, chemical resistance, and strength.

Other Additives

In an implementation, the epoxy resin composition for encapsulating a semiconductor device may further include additives such as a release agent, a stress relieving agent, a crosslinking promoter, a leveling agent, a flame retardant, or the like. In an implementation, the additives may be present in an amount of about 0.1 wt % to about 10 wt %, e.g., about 0.1 wt % to about 3 wt %, based on the total weight of the epoxy resin composition.

In an implementation, the release agent may include, e.g., paraffin wax, ester wax, higher fatty acids, metal salts of higher fatty acids, natural fatty acids, and/or natural fatty acid metal salts. In an implementation, the release agent may be present in an amount of about 0.1 wt % to about 1 wt %, based on the total weight the epoxy resin composition.

In an implementation, the stress relieving agent may include, e.g., modified silicone oil, silicone elastomers, silicone powder, and/or silicone resin. For example, as the modified silicone oil, any silicone polymers having good heat resistance may be used. The modified silicone oil may be a silicone oil mixture, which includes silicone oil having an epoxy functional group, silicone oil having an amine functional group, silicone oil having a carboxyl functional group, or a combination thereof. For example, silicone powder having an average particle diameter of about 15 μm or less may be used. In an implementation, the stress relieving agent may be present in an amount of about 0.1 wt % to about 1 wt %, based on the total weight of the epoxy resin composition.

In an implementation, the epoxy resin composition for encapsulating a semiconductor device according to the embodiments may exhibit high heat resistance to prevent discoloration of a semiconductor package, may help secure good chip shielding performance, and may help provide a complementary color with respect to a color of the semiconductor package through the thermochromic pigment upon laser marking so as to achieve clear marking without excessive laser irradiation, thereby enabling protection of the semiconductor chip while providing a color semiconductor package with a pleasing appearance for users.

In an implementation, the epoxy resin composition may be prepared by a process in which components of the epoxy resin composition are uniformly mixed using a Henschel mixer or a Lödige mixer, followed by melt kneading using a roll mill or a kneader at about 90° C. to about 120° C., and then cooling and pulverizing. As a method for encapsulating a semiconductor device using the epoxy resin composition obtained according to the embodiments, low-pressure transfer molding may be used. In an implementation, injection molding or casting may also be employed for molding of the epoxy resin composition. A semiconductor device that may be fabricated by such a molding process may include a copper lead frame, an iron lead frame, an iron or copper lead frame pre-plated with at least one metal selected from among nickel, copper and palladium, or an organic laminate frame.

Semiconductor Device

A semiconductor device according to one embodiment may be encapsulated by the epoxy resin composition according to the embodiments of.

For example, a molding machine suitable for a molding method may be selected, and a semiconductor device may be encapsulated by the epoxy resin composition using the molding machine, followed by curing, thereby providing a semiconductor device package in which the semiconductor device is encapsulated. In an implementation, the encapsulation molding may be performed at about 160° C. to about 190° C. for about 40 seconds to about 300 seconds, and post-curing may be performed at about 160° C. to about 190° C. for 8 hours or less.

Semiconductor Package

A semiconductor package according to one embodiment may include: a substrate; a semiconductor device mounted on the substrate; a connection part electrically connecting the semiconductor device to the substrate; and a molding part encapsulating the semiconductor device and the connection part, wherein the molding part is formed of the epoxy resin composition for encapsulating a semiconductor device according to the embodiments.

The semiconductor package according to the embodiment may include a plurality of semiconductor devices, and these semiconductor devices may be mounted on the substrate via a die-bonding film.

FIG. 1 illustrates a schematic sectional view of a semiconductor package according to one embodiment. Referring to FIG. 1, a semiconductor package 100 according to one embodiment may be a board-on-chip (BOC) type semiconductor package, and may include a substrate 110, a die-bonding film 130 on the substrate 110, a semiconductor device 120 attached to an upper side of the substrate 110 via a die-bonding film 130, a connection part 150 (such as a bonding wire), which electrically connects the semiconductor device 120 to the substrate 110, and a molding part 140 encapsulating the semiconductor device 120 and the connection part 150 while protecting a mounting structure, which includes the substrate 110, the semiconductor device 120 mounted on the substrate 110, and the connection part 150.

A plurality of solder balls 160 may be formed on a surface of the substrate 120 opposite to a mounting surface of the substrate 120 on which the semiconductor device 120 is mounted, and electrically connects the semiconductor device 120 to an external circuit.

The molding part 140 may be formed to completely cover the semiconductor device 120 and the connection part 150 on the substrate 110.

The molding part 140 may include or be formed from the epoxy resin composition for encapsulating a semiconductor device according to the embodiments, and the die-bonding film 130 may be a silicone die-bonding film.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Details of components used in the following Example and Comparative Examples are as follows.

(A) Epoxy Resin:
(a1) Ortho cresol novolac type epoxy resin: EOCN-1020-55 (Nippon Kayaku Co., Ltd.)
(a2) Biphenyl type epoxy resin: YX-4000 (Japan Epoxy Resin Co., Ltd.)
(a3) Phenol aralkyl type epoxy resin: NC-3000 (Nippon Kayaku Co., Ltd.)
(B) Curing Agent:
(b1) Phenol novolac resin: HF-1 (Meiwa Kasei Industries, Ltd.)
(b2) Xylok type phenol resin: KPH-F3065 (Kolon Chemical Co., Ltd.)
(b3) Phenol aralkyl type phenol resin: MEH-7851SS (Meiwa Kasei Industries, Ltd.)
(C) Curing Accelerator:
(c1) Triphenylphosphine curing accelerator: TPP ((Hokko Chemical Co., Ltd.)
(c2) Imidazole curing accelerator: 2E4MZ-CN (Nippon Gosei Co., Ltd.)
(D) Filler: A mixture of spherical fused silica having an average particle diameter of 20 μm and spherical fused silica having an average particle diameter of 0.5 an mixed in a ratio of 9:1 ($D_{50}$=14)
(E) Silane Coupling Agent:
(e1) Methyltrimethoxysilane: SZ-6070 (Dow-Corning Company)
(e2) γ-glycidoxypropyltrimethoxysilane: S-510 (Chisso Co., Ltd.)
(F) White Additive:
(f1) Talc (Si/Mg)): TA-3120 (DainChem Co., Ltd.)
(f2) Barium sulfate ($BaSO_4$): BA-490Z (DainChem Co., Ltd.)
(f3) Zinc sulfide (ZnS): ZS-A310 (DainChem Co., Ltd.)
(f4) Zinc sulfate ($ZnSO_4$): ZS-853W (DainChem Co., Ltd.)
(f5) kaolin ($Al_2Si_2O_5(OH)_4$): DS-10 (DainChem Co., Ltd.)
(f6) Titanium dioxide ($TiO_2$): BT-A114 (DainChem Co., Ltd.)
(G) Thermochromic Pigment: Oxalate Thermochromic Pigment TR-3100 (Terada Chemical Co., Ltd., Color Change Temperature: 310° C.)
(H) Colorant: Blue KRO (Wise Chem Co., Ltd.)

EXAMPLES 1 TO 3 AND COMPARATIVE EXAMPLES 1 TO 3

The components were weighed in amounts as listed in Table 1 and uniformly mixed at 25° C. to 30° C. for 30 minutes using a Henschel mixer (KSM-22, Keum Sung Machinery Co., Ltd.), followed by melt kneading at a temperature of up to 110° C. for 30 minutes using a continuous kneader and then cooling to 10° C. to 15° C. and pulverizing, thereby preparing an epoxy resin composition for encapsulating a semiconductor device.

TABLE 1

| Composition (wt %) | | Example | | | Comparative Example | | |
|---|---|---|---|---|---|---|---|
| | | 1 | 2 | 3 | 1 | 2 | 3 |
| (A) | (a1) | 2.46 | 0 | 0 | 2.29 | 0 | 0 |
| | (a2) | 0 | 2.18 | 0 | 0 | 1.98 | 0 |
| | (a3) | 0 | 0 | 2.04 | 0 | 0 | 2.4 |
| (B) | (b1) | 2.24 | 0 | 0 | 2.08 | 0 | 0 |
| | (b2) | 0 | 1.97 | 0 | 0 | 1.77 | 0 |
| | (b3) | 0 | 0 | 1.82 | 0 | 0 | 2.2 |
| (C) | (c1) | 0.1 | 0 | 0.2 | 0.1 | 0 | 0.2 |
| | (c2) | 0.1 | 0.2 | 0 | 0.1 | 0.2 | 0 |
| (D) | | 88 | 88 | 88 | 88 | 88 | 88 |
| (E) | (e1) | 0 | 0 | 0.74 | 0.2 | 0.35 | 0.1 |
| | (e2) | 0 | 0.45 | 0 | 0.23 | 0.7 | 0.1 |
| (F) | (f1) | 1 | 1 | 0 | 1 | 0 | 0 |
| | (f2) | 2 | 0 | 0 | 0 | 1 | 0 |
| | (f3) | 2 | 2 | 4 | 2 | 2 | 0 |
| | (f4) | 0 | 2 | 0 | 0 | 0 | 0 |
| | (f5) | 0 | 0 | 1 | 2 | 0 | 0 |
| | (f6) | 0 | 0 | 0 | 0 | 2 | 5 |
| (G) | | 0.1 | 0.2 | 0.2 | 0 | 0 | 0 |
| (H) | | 2 | 2 | 2 | 2 | 2 | 2 | transfer pressure of 9 MPa, and a transfer speed of 1 mm/sec for a curing time of 120 sec to obtain a standard specimen having a diameter of 95 mm and a thickness of 3 mm, which in turn was subjected to secondary curing at 175° C. for 4 hours. Marking was performed on the resulting specimen using a YAG laser marking machine (EO Technics Co., Ltd.) under conditions of wavelength: 1,060 nm, pulse width: 120 μsec, beam output: 1.3 J/pulse).

After laser marking, a marking depth (Depth) of the specimen was measured using a confocal laser scanning microscope (CLSM) (Fluoview FV300, Olympus Co., Ltd.) under conditions of electric current: 2.5 A, frequency: 15 kHz and duty ratio: 43%.

Figure 2:
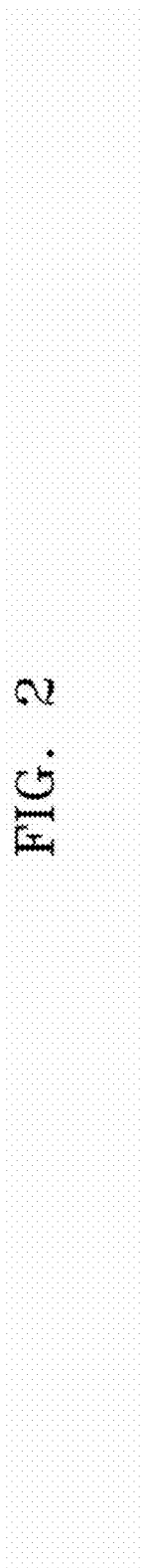
FIG. 2 illustrates images of specimens of the Examples and Comparative Examples after laser marking.

For visibility of laser marking, a specimen in which the marked character of was clearly observed by the naked eye was rated as ○, and a specimen in which the marked character was not observable by the naked eye, was rated as X. Images of the specimens prepared using the resin compositions of the Examples and Comparative Examples are shown in FIG. 2.

TABLE 2

| Evaluation Item | | | Example | | | Comparative Example | | |
|---|---|---|---|---|---|---|---|---|
| | | | 1 | 2 | 3 | 1 | 2 | 3 |
| Heat resistance (ΔDE) | NPC (standard specimen) | ΔDE | (—) | (—) | (—) | (—) | (—) | (—) |
| | | Measured value | 48.3 | 41.5 | 35.5 | 48.5 | 49.2 | 53.82 |
| | NPC + IR | ΔDE | 1.28 | 1.22 | 1.13 | 1.49 | 1.56 | 1.52 |
| | | Measured value | 49.5 | 42.7 | 36.6 | 50 | 50.8 | 55.34 |
| | PMC | ΔDE | 1.51 | 1.46 | 1.38 | 1.73 | 1.84 | 1.79 |
| | | Measured value | 49.8 | 42.9 | 36.8 | 50.2 | 51.1 | 55.61 |
| | PMC + IR | ΔDE | 1.67 | 1.58 | 1.44 | 1.88 | 1.96 | 1.83 |
| | | Measured value | 49.9 | 43.1 | 36.9 | 50.4 | 51.2 | 55.65 |
| Laser marking performance | Marking Depth (μm) | | 62 | 58 | 61 | 78 | 83 | 86 |
| | Visibility | | ○ | ○ | ○ | X | X | ○ |

Property Evaluation (1) Heat resistance: Each of the epoxy resin compositions prepared in the Examples and Comparative Examples was molded at a temperature of 75° C., a transfer pressure of 9 MPa, and a transfer speed of 1 mm/sec for a curing time of 120 sec to obtain a standard specimen (hereinafter, NPC specimen) having a diameter of 5 mm and a thickness of 1 mm. The NPC specimen was subjected to IR reflow under conditions of 250 rpm and 260° C. to prepare an NPC-IR specimen. Then, the NPC specimen was cured at 175° C. for 4 hours to prepare a PMC specimen, which in turn was subjected to IR reflow under conditions of 250 rpm and 260° C., thereby preparing a PMC-IR specimen. With reference to the color of the NPC specimen, a color change (ΔDE) of each of the NPC-IR specimen, the PMC specimen, and the PMC-IR specimen was measured using a colorimeter (Minola-3700). A lower color change rate (ΔDE) indicates better heat resistance.

(2) Laser marking performance: Each of the epoxy resin compositions prepared in the Examples and Comparative Examples was molded at a mold temperature of 175° C., a From Table 2, it may be seen that the epoxy resin compositions of the Examples exhibited good heat resistance, thus having a low color change (ΔDE) and providing a low marking depth to help prevent damage to a chip, and could secure good marking visibility. Conversely, it may be seen that the epoxy resin composition of Comparative Examples 1 and 2 (not containing the thermochromic pigment) exhibited poor heat resistance, had a large color change, provided a deep marking depth causing chip damage, and had poor marking visibility.

By way of summation and review, a color compound applied to a color package could be vulnerable to heat, could have low chip shielding performance, or could exhibit higher reflectivity with respect to laser beams (compared with a black compound) upon laser marking, thereby providing lower marking visibility.

In order to improve marking visibility, laser marking may be be repeatedly performed on the same site or performed at higher intensity. It is possible that such a marking method could damage or destroy chips inside a semiconductor package due to a large amount of heat from laser beams.

As such, the embodiments may provide an epoxy resin composition for encapsulating a semiconductor device, which exhibits various colors such as red, green, blue, and white (RGBW) while securing good marking visibility. The epoxy resin composition for encapsulating a semiconductor device according to an embodiment may exhibit good heat resistance to thus help reduce and/or prevent discoloration of a semiconductor package while securing good chip shielding performance.

The embodiments may provide an epoxy resin composition for encapsulating a semiconductor device, which exhibits or shows various colors, such as red, green, blue, and white (RGBW) colors.

The embodiments may provide an epoxy resin composition for encapsulating a semiconductor device, which exhibits various colors and good marking visibility.

The embodiments may provide an epoxy resin composition for encapsulating a semiconductor device, which exhibits high heat resistance to suppress discoloration of a semiconductor package due to heat, thereby enabling low depth marking.

The embodiments may provide an epoxy resin composition for encapsulating a semiconductor device, which exhibits good chip shielding properties.

.Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An epoxy resin composition for encapsulating a semiconductor device, the composition comprising:
    a base resin;
    a filler;
    a colorant; and
    a thermochromic pigment, wherein:
    a color of the thermochromic pigment is irreversibly changed when a temperature thereof exceeds a predetermined temperature, and
    the thermochromic pigment is a metal oxalate pigment.

2. The epoxy resin composition as claimed in claim 1, wherein the thermochromic pigment is represented by the following Formula 1:

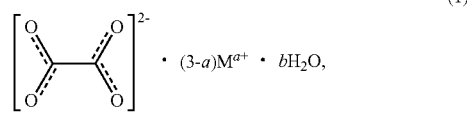

wherein, in Formula 1, a is 1 or 2, b is 1 to 10, and M is a metal element.

3. The epoxy resin composition as claimed in claim 2, wherein the metal element is an alkali metal, an alkali earth metal, a group XIII element, a group XIV element, a group XI element, a group XII element, a group III element, a group IV element, a group V element, a group VI element, a group VII element, a group VIII element, a group IX element, or a group X element.

4. The epoxy resin composition as claimed in claim 1, wherein the predetermined temperature at which the thermochromic pigment undergoes the irreversible color change is about 260° C. or higher.

5. The epoxy resin composition as claimed in claim 1, wherein the thermochromic pigment is present in the epoxy resin composition in an amount of about 0.01wt % to about 5 wt %, based on a total weight of the epoxy resin composition.

6. The epoxy resin composition as claimed in claim 1, wherein the colorant includes sodium, calcium, aluminum, tin, gold, zinc, yttrium, titanium, tantalum, chromium, manganese, iron, cobalt, iridium, nickel, palladium, or mixtures thereof.

7. The epoxy resin composition as claimed in claim 1, wherein the colorant is present in the epoxy resin composition in an amount of about 0.05 wt % to about 10wt %, based on a total weight of the epoxy resin composition.

8. The epoxy resin composition as claimed in claim 1, wherein the base resin includes an epoxy resin and a curing agent.

9. The epoxy resin composition as claimed in claim 1, wherein the composition includes:
    about 1 wt % to about 30 wt % of the base resin,
    about 65 wt % to about 97 wt % of the filler,
    about 0.05 wt % to about 10 wt % of the colorant, and
    about 0.01 wt % to about 5 wt % of the thermochromic pigment, all wt % being based on a total weight of the epoxy resin composition.

10. The epoxy resin composition as claimed in claim 1, further comprising: a curing accelerator.

11. The epoxy resin composition as claimed in claim 10, wherein the curing accelerator includes a triphenylphosphine compound, an imidazole compound, or mixtures thereof.

12. The epoxy resin composition as claimed in claim 10, wherein the curing accelerator is present in the epoxy resin composition in an amount of about 0.001 wt % to about 1 wt %, based on a total weight of the epoxy resin composition.

13. The epoxy resin composition as claimed in claim 1, further comprising a white additive, the white additive including talc, barium sulfate, zinc sulfide, zinc sulfate, kaolin, or mixtures thereof.

14. The epoxy resin composition as claimed in claim 13, wherein the white additive is present in the epoxy resin composition in an amount of about 0.1 wt % to about 20 wt %, based on a total weight of the epoxy resin composition.

15. The epoxy resin composition as claimed in claim 1, further comprising a silane coupling agent.

16. The epoxy resin composition as claimed in claim 1, wherein the color of the thermochromic pigment after the irreversible change is different from a color of the colorant.

17. The epoxy resin composition as claimed in claim 1, wherein the color of the thermochromic pigment after the irreversible change is complementary to a color of the colorant.

18. A semiconductor device encapsulated by the epoxy resin composition as claimed in claim 1.

19. A method of manufacturing a device, the method comprising:
    encapsulating a semiconductor device with the epoxy resin composition as claimed in claim 1; and
    marking a site on the encapsulated semiconductor device such that the site maintains a color that is different from other parts of the encapsulated semiconductor.

20. An epoxy resin composition for encapsulating a semiconductor device, the composition comprising:

a base resin;
a filler;
a colorant; and
a thermochromic pigment, wherein:
a color of the thermochromic pigment is irreversibly changed when a temperature thereof exceeds a predetermined temperature, and
the thermochromic pigment is present in the epoxy resin composition in an amount of about 0.01 wt % to about 5 wt %, based on a total weight of the epoxy resin composition.

21. An epoxy resin composition for encapsulating a semiconductor device, the composition comprising:
a base resin;
a filler;
a colorant; and
a thermochromic pigment, wherein:
a color of the thermochromic pigment is irreversibly changed when a temperature thereof exceeds a predetermined temperature, and
the color of the thermochromic pigment after the irreversible change is complementary to a color of the colorant.

* * * * *